United States Patent
Haddej

(10) Patent No.: US 11,360,149 B2
(45) Date of Patent: Jun. 14, 2022

(54) DETERMINING BATTERY WEAR OF A MOBILE ELECTRONIC DEVICE

(71) Applicant: Blancco Technology Group IP OY, Joensun (FI)

(72) Inventor: Dhia Ben Haddej, Austin, TX (US)

(73) Assignee: BLANCCO TECHNOLOGY GROUP IP OY, Joensun (FI)

( * ) Notice: Subject to any disclaimer, the term of this patent is extended or adjusted under 35 U.S.C. 154(b) by 0 days.

(21) Appl. No.: 16/967,676

(22) PCT Filed: Mar. 27, 2019

(86) PCT No.: PCT/EP2019/057705
§ 371 (c)(1),
(2) Date: Aug. 5, 2020

(87) PCT Pub. No.: WO2019/185701
PCT Pub. Date: Oct. 3, 2019

(65) Prior Publication Data
US 2021/0293887 A1  Sep. 23, 2021

(30) Foreign Application Priority Data
Mar. 28, 2017 (GB) .................................... 1805092

(51) Int. Cl.
*G01R 31/367* (2019.01)
*G01R 31/392* (2019.01)
*G01R 31/371* (2019.01)

(52) U.S. Cl.
CPC ......... *G01R 31/367* (2019.01); *G01R 31/371* (2019.01); *G01R 31/392* (2019.01)

(58) Field of Classification Search
CPC ... G01R 31/367; G01R 31/371; G01R 31/392
See application file for complete search history.

(56) References Cited

U.S. PATENT DOCUMENTS 10,401,433 B2 * 9/2019 Chow ................ G01R 31/3648
2014/0015532 A1 1/2014 Uchida et al.
(Continued)

FOREIGN PATENT DOCUMENTS

CN 106842065 6/2017

OTHER PUBLICATIONS

International Searching Authority, International Preliminary Report on Patentability dated Sep. 29, 2020 in Application No. PCT/EP2019/057705.
(Continued)

*Primary Examiner* — Bryan Bui
(74) *Attorney, Agent, or Firm* — Dickinson Wright PLLC

(57) ABSTRACT

A method for determining a wear value of a battery of a mobile electronic device comprises using historical battery status data to estimate an actual capacity $Q_{act}$ of the battery and using a design capacity $Q_{des}$ of the battery and the estimated actual capacity $Q_{act}$ of the battery to determine the wear value of the battery. A computer program is configured so that, when executed by a processor, the processor implements the method for determining a wear value of a battery of a mobile electronic device.

28 Claims, 6 Drawing Sheets

(56) References Cited

U.S. PATENT DOCUMENTS

| | | |
|---|---|---|
| 2015/0046109 A1 | 2/2015 | Miwa et al. |
| 2016/0116510 A1 | 4/2016 | Kalous et al. |
| 2016/0209472 A1 | 7/2016 | Chow et al. |
| 2016/0349330 A1* | 12/2016 | Barfield, Jr. ........... G07C 5/008 |
| 2017/0106766 A1 | 4/2017 | Duan et al. |
| 2017/0328957 A1 | 11/2017 | Suzuki et al. |
| 2018/0083461 A1 | 3/2018 | Ravi et al. |

OTHER PUBLICATIONS

International Searching Authority, Written Opinion of the International Searching Authority dated Sep. 29, 2020 in Application No. PCT/EP2019/057705.

You Gae-Won et al: "Real-time state-of-health estimation for electric vehicle batteries: A data-driven approach", Applied Energy, Elsevier Science Publishers, GB, vol. 176, May 14, 2016 (May 14, 2016), pp. 92-103.

* cited by examiner

DETERMINING BATTERY WEAR OF A MOBILE ELECTRONIC DEVICE

CROSS-REFERENCE TO RELATED APPLICATIONS

This application is a national stage application of PCT/EP2019/057705, filed on Mar. 27, 2019, which claims priority to GB Application No. 1805092.2, filed on Mar. 28, 2018, which are hereby incorporated by reference in their entirety for all purposes.

FIELD

The present disclosure relates to methods and apparatus for determining a wear value for a battery of a mobile electronic device. The present disclosure also relates to a computer program which, when executed by a processor, is configured to implement a method for determining a wear value for a battery of a mobile electronic device and a data storage medium including such a computer program.

BACKGROUND

In the mobile phone market, battery life is one of the most important characteristics of a mobile phone because the battery life can affect the usage possibilities, price, customer base and re-sale value of the mobile phone.

Over time, the capacity of a battery decreases. Scientifically this can be measured by the wear level which may be defined as the percentage of the actual charge capacity that is lost from the original design charge capacity.

It is known to determine the actual charge capacity of a battery of a mobile phone either through hardware using a physical battery tester. Such methods usually involve removing the battery from the mobile phone and running it through discharge and charge cycles taking a few hours which presents an inconvenience both in the time it takes and in the need to remove the battery.

Determining battery wear is a particular problem for Android devices which, as of 2018, represent more than 80% of the market share. Samsung is the leading phone manufacturer of Android devices and most of the recent Samsung phone models have batteries that cannot even be removed to be physically tested. Known battery monitoring apps/solutions for Android devices require that an app be installed and running on the device during one or multiple charge cycles, which can last a few hours.

SUMMARY

According to an aspect or an embodiment of the present disclosure there is provided a method for determining a wear value of a battery of a mobile electronic device, the method comprising:
using historical battery status data to estimate an actual capacity $Q_{act}$ of the battery; and
using a design capacity $Q_{des}$ of the battery and the estimated actual capacity $Q_{act}$ of the battery to determine the wear value of the battery.

The method may comprise accessing the design capacity $Q_{des}$ of the battery from the mobile electronic device.

The method may comprise deploying an app on the mobile electronic device to extract the design capacity $Q_{des}$ of the battery from the mobile electronic device.

The method may comprise accessing the historical battery status data for the battery from a memory of the mobile electronic device.

The method may comprise accessing the historical battery status data for the battery from a battery stats log file of the mobile electronic device.

The mobile electronic device may comprise or run an Android operating system.

The mobile electronic device may comprise or run Android Marshmallow Versions 6.0-6.0.1, Android Nougat Versions 7.0-7.1.2, Android Oreo Versions 8.0-8.1 or Android P Version 9.

The mobile electronic device may comprise a Samsung device. The mobile electronic device may comprise a phone such as a Samsung phone.

The method may comprise outputting, for example displaying, the wear value of the battery.

The method may comprise storing the wear value of the battery.

As opposed to known prior art solutions, the method of the present disclosure may not monitor the active charge. Consequently, the method of the present disclosure may not require a user to charge the mobile electronic device. Also, in the case where the battery is full, the method of the present disclosure may not require the user to wait for the mobile electronic device to drain before recharging. In contrast, the method of the present disclosure may use data from the existing battery stats log that is also displayed on the Samsung Battery Usage UI stats. This means that the method of the present disclosure may be much faster and easier to use than known methods for determining the wear of a battery of a mobile electronic device running Android such as a Samsung mobile electronic device or a Samsung phone.

The method of the present disclosure may solve the problem of determining battery wear on a software level and in under a few seconds. It may only require the mobile device to be plugged through a USB cable into a machine running appropriate software and it may determine the actual charge capacity of the battery in under a few seconds.

The method of the present disclosure may not require any dedicated battery testing hardware. The method of the present disclosure may not require the user to remove the battery from the phone.

The method of the present disclosure may also be very fast. For example, the method of the present disclosure may run in under a few seconds as opposed to taking a couple of hours using expensive hardware that will void the warranty of phones that have non-removable batteries. This may translate into lots of saved revenue through the time saved. This may eliminate the need for extra hardware or a dedicated operator. This may provide a better experience to the user.

The method of the present disclosure may have multiple applications. For example, it can be used in the mobile processor environment where phones need to be tested and have their re-sale value determined partly through the remaining battery life. It can also be used in the mobile retail environment to help customers establish if they have an issue with their battery (drain versus wear) and prevent loss revenue from false returns and further diagnosis. It can also be used in the mobile repair environment where it can help find NFF or help in pin-pointing issues. It can be useful as a customer self-diagnosis solution because it may allow the end customer to perform the test himself before having to go in store and, as such, save customer support time and increase customer satisfaction.

The method of the present disclosure may also be more accurate than known methods for determining battery wear because the method of the present disclosure can use battery charge status data from multiple past charge events.

The historical battery status data may comprise time information and battery charging status information.

The method may comprise using the time information and the battery charging status information to identify a battery charge interval during which the battery was charged.

The historical battery status data may comprise a plurality of historical battery charge data points for each battery charge interval, wherein each historical battery charge data point comprises time information, battery charging current information, and battery charge information.

The time information may comprise a relative time value or time stamp.

The battery charging current information may comprise a value of charging current supplied to the battery.

The battery charge information may comprise a fractional value of the actual capacity $Q_{act}$ of the battery, expressed as a fraction or as a percentage of the actual capacity $Q_{act}$ of the battery.

The method may comprise using the time information and the battery charging status information to identify a plurality of battery charge intervals during which the battery was charged.

The method may comprise identifying one or more battery charge ranges within each of the one or more battery charge intervals.

The method may comprise determining, for each battery charge range, an estimate $Q_{act}(k)$ of the actual charge capacity $Q_{act}$ of the battery, where k is an index assigned to each battery charge range according to the numerical order in which the fractional values of the actual capacity $Q_{act}$ of the battery in the battery charge ranges occur.

The method may comprise estimating the actual capacity $Q_{act}$ of the battery by averaging the estimates $Q_{act}(k)$ of the actual capacity of the battery for all of the battery charge ranges according to the formula:

$$Q_{act} = \frac{1}{N_k} \sum_{\forall k} Q_{act}(k)$$

where $N_k$ is the total number of battery charge ranges. It is known that the charge behaviour of a battery of a mobile electronic device is generally non-linear and it is thought that the accuracy of the measurement of the battery charge information may vary across the full range of fractional values of the actual capacity $Q_{act}(k)$ of the battery. Consequently, averaging the estimates $Q_{act}(k)$ of the actual capacity of the battery for all of the battery charge ranges in this way may improve the accuracy of the estimate of the actual capacity $Q_{act}$ of the battery because it may average out or reduce any variations in the accuracy of the battery charge information across the full range of fractional values of the actual capacity $Q_{act}$ of the battery. It is also thought that the accuracy of the measurement of the battery charge information may vary with usage of the mobile electronic device during charging. Averaging the estimates $Q_{act}(k)$ of the actual capacity of the battery for all of the battery charge ranges in this way, may also help to account for any variation in the accuracy of the measurement of the battery charge information with usage of the mobile electronic device during charging, thereby helping to improve the accuracy of the estimate of the actual capacity $Q_{act}$ of the battery.

The method may comprise determining the wear value of the battery expressed as a percentage wear value $W_p$ according to the formula:

$$W_p = 100 \times \left(1 - \frac{Q_{act}}{Q_{des}}\right)$$

where $Q_{act}$ is the estimated actual capacity of the battery and $Q_{des}$ the design capacity of the battery.

The method may comprise determining the wear value of the battery expressed as a fractional wear value $w_f$ according to the formula:

$$W_f = 1 - \frac{Q_{act}}{Q_{des}}$$

where $Q_{act}$ is the estimated actual capacity of the battery and $Q_{des}$ the design capacity of the battery.

The method may comprise identifying any common battery charge ranges in which the fractional values of the actual capacity $Q_{act}$ of the battery of one battery charge interval overlap with the fractional values of the actual capacity $Q_{act}$ of the battery of any one or more other battery charge intervals.

The method may comprise identifying any unique battery charge ranges in which none of the fractional values of the actual capacity $Q_{act}$ of the battery of one battery charge interval overlap with the fractional values of the actual capacity $Q_{act}$ of the battery of any one or more other battery charge intervals.

The method may comprise determining, for each common battery charge range and for each battery charge interval to which the common battery charge range is common, an estimate $Q_{act}(i,k)$ of the actual capacity of the battery according to the formula:

$$Q_{act}(i,k) = \Delta Q(i,k) / [f_{final}(i,k) - f_{initial}(i,k)]$$

where $f_{initial}(i,k)$ is the initial fractional value of the actual capacity of the battery expressed as a fraction at the beginning of the $k^{th}$ battery charge range in the $i^{th}$ battery charge interval;

where $f_{final}(i,k)$ is the final fractional value of the actual capacity of the battery expressed as a fraction at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

The method may comprise determining, for each common battery charge range and for each battery charge interval to which the common battery charge range is common, an estimate $Q_{act}(i,k)$ of the actual capacity of the battery according to the formula:

$$Q_{act}(i,k) = \Delta Q(i,k) \times 100 / [p_{final}(i,k) - p_{initial}(i,k)]$$

where $p_{initial}(i,k)$ is the initial fractional value of the actual capacity of the battery expressed as a percentage at the beginning of the $k^{th}$ battery charge range in the $i^{th}$ battery charge interval;

where $p_{final}(i,k)$ is the final fractional value of the actual capacity of the battery expressed as a percentage at the end of the $k^{th}$ battery charge range in the $i^{th}$ battery charge interval; and where ΔQ(i,k) is the total charge supplied to the battery over the $k^{th}$ battery charge range in the $i^{th}$ battery charge interval.

The method may comprise determining, for each common battery charge range and for each battery charge interval to which the common battery charge range is common, the total charge ΔQ(i,k) supplied to the battery over the $k^{th}$ battery charge range in the $i^{th}$ battery charge interval.

The method may comprise determining, for each common battery charge range and for each battery charge interval to which the common battery charge range is common, the total charge ΔQ(i,k) supplied to the battery over the $k^{th}$ battery charge range in the $i^{th}$ battery charge interval according to:

$$\Delta Q(i,k) = I_{avg}(i,k) \times T(i,k)$$

where $I_{avg}(i,k)$ is the average battery charging current supplied to the battery over the $k^{th}$ battery charge range in the $i^{th}$ battery charge interval, and T(i,k) is the duration of the $k^{th}$ battery charge range in the $i^{th}$ battery charge interval determined according to the formula:

$$T(i,k) = t_{final}(i,k) - t_{initial}(i,k)$$

where $t_{initial}(i,k)$ is the relative time value or time stamp corresponding to the first battery charge data point of the $k^{th}$ battery charge range in the $i^{th}$ battery charge interval, and $t_{final}(i,k)$ is the relative time value or time stamp corresponding to the last battery charge data point of the $k^{th}$ battery charge range in the $i^{th}$ battery charge interval.

The method may comprise determining, for each common battery charge range and for each battery charge interval to which the common battery charge range is common, the average battery charging current $I_{avg}(i,k)$ supplied to the battery over the $k^{th}$ battery charge range in the $i^{th}$ battery charge interval.

The method may comprise determining, for each common battery charge range and for each battery charge interval to which the common battery charge range is common, the average battery charging current $I_{avg}(i,k)$ supplied to the battery over the $k^{th}$ battery charge range in the $i^{th}$ battery charge interval according to the formula:

$$I_{avg}(i,k) = \frac{1}{N_j(i,k)} \sum_{\forall j \in i, k} I_j$$

where $I_j$ is the battery charging current supplied to the battery corresponding to the $j^{th}$ historical battery charge data point, $\forall j \in i, k$ indicates that the summation should be performed over all of the historical battery charge data points in the $k^{th}$ battery charge range in the $i^{th}$ battery charge interval, and $N_j(i,k)$ is the total number of historical battery charge data points in the $k^{th}$ battery charge range in the $i^{th}$ battery charge interval.

The method may comprise determining, for each common battery charge range and for each battery charge interval to which the common battery charge range is common, the total charge ΔQ(i,k) supplied to the battery over the $k^{th}$ battery charge range in the $i^{th}$ battery charge interval by integrating the charging current supplied to the battery over the common battery charge range in the battery charge interval.

The method may comprise determining, for each common battery charge range and for each battery charge interval to which the common battery charge range is common, the total charge ΔQ(i,k) supplied to the battery over the $k^{th}$ battery charge range in the $i^{th}$ battery charge interval according to:

$$\Delta Q(i,k) = \sum_{\forall j \in i, k} \Delta t_j \cdot I_j$$

where $$\Delta t_j = \frac{1}{2}(t_{j+1} - t_{j-1})$$

where $t_j$ is the relative time value or time stamp corresponding to the $j^{th}$ historical battery charge data point, where $I_j$ is the battery charging current supplied to the battery corresponding to the $j^{th}$ historical battery charge data point and where $\forall j \in i, k$ indicates that the summation should be performed over all of the historical battery charge data points in the $k^{th}$ battery charge range in the $i^{th}$ battery charge interval.

The method may comprise determining, for each common battery charge range, an average of the estimates $Q_{act}(i,k)$ of the actual capacity of the battery over each battery charge interval to which the common battery charge range is common so as to provide an improved estimate $Q_{act}(k)$ of the actual capacity $Q_{act}$ of the battery for the $k^{th}$ battery charge range according to the formula:

$$Q_{act}(k) = \frac{1}{N_{icom}(k)} \sum_{\forall i \in i_{com}} Q_{act}(i,k)$$

where $\forall i \in i_{com}$ indicates that the summation should be performed over all of the battery charge intervals to which the $k^{th}$ battery charge range is common and $N_{icom}(k)$ is the number of battery charge intervals to which the $k^{th}$ battery charge range is common. It is also thought that the accuracy of the measurement of the battery charge information may vary with usage of the mobile electronic device during charging. Averaging the estimates of the actual capacity of the battery in this way across each battery charge interval to which each common battery charge range is common, may help to account for any variation in accuracy of the measurement of the battery charge information with the usage of the mobile electronic device during charging in the common battery charge range in different battery charge intervals, thereby helping to improve the accuracy of the estimate of the actual capacity of the battery.

The method may comprise determining, for each unique battery charge range, an estimate $Q_{act}(k)$ of the actual capacity of the battery according to the formula:

$$Q_{act}(k) = \Delta Q(i,k) / [f_{final}(i,k) - f_{initial}(i,k)]$$

where $f_{initial}(i,k)$ is the initial fractional value of the actual capacity of the battery expressed as a fraction at the beginning of the $k^{th}$ battery charge range in the $i^{th}$ battery charge interval;

where $f_{final}(i,k)$ is the final fractional value of the actual capacity of the battery expressed as a fraction at the end of the $k^{th}$ battery charge range in the $i^{th}$ battery charge interval; and where ΔQ(i,k) is the total charge supplied to the battery over the $k^{th}$ battery charge range in the $i^{th}$ battery charge interval.

The method may comprise determining, for each unique battery charge range, an estimate $Q_{act}(k)$ of the actual capacity of the battery according to the formula:

$$Q_{act}(k) = \Delta Q(i,k) \times 100 / [p_{final}(i,k) - p_{initial}(i,k)]$$

where $p_{initial}(i,k)$ is the initial fractional value of the actual capacity of the battery expressed as a percentage at the beginning of the $k^{th}$ battery charge range in the $i^{th}$ battery charge interval;

where $p_{final}(i,k)$ is the final fractional value of the actual capacity of the battery expressed as a percentage at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

The method may comprise determining, for each unique battery charge range, the total charge $\Delta Q(i,k)$ supplied to the battery over the $k^{th}$ battery charge range in the $i^{th}$ battery charge interval.

The method may comprise determining, for each unique battery charge range, the total charge $\Delta Q(i,k)$ supplied to the battery over the $k^{th}$ battery charge range in the $i^{th}$ battery charge interval according to:

$$\Delta Q(i,k) = I_{avg}(i,k) \times T(i,k)$$

where $I_{avg}(i,k)$ is the average battery charging current supplied to the battery over the $k^{th}$ battery charge range in the $i^{th}$ battery charge interval, and $T(i,k)$ is the duration of the $k^{th}$ battery charge range in the $i^{th}$ battery charge interval determined according to the formula:

$$T(i,k) = t_{final}(i,k) - t_{initial}(i,k)$$

where $t_{initial}(i,k)$ is the relative time value or time stamp corresponding to the first battery charge data point of the $k^{th}$ battery charge range in the $i^{th}$ battery charge interval, and $t_{final}(i,k)$ is the relative time value or time stamp corresponding to the last battery charge data point of the $k^{th}$ battery charge range in the $i^{th}$ battery charge interval.

The method may comprise determining, for each unique battery charge range, the average battery charging current $I_{avg}(i,k)$ supplied to the battery over the $k^{th}$ battery charge range in the $i^{th}$ battery charge interval.

The method may comprise determining, for each unique battery charge range, the average battery charging current $I_{avg}(i,k)$ supplied to the battery over the $k^{th}$ battery charge range in the $i^{th}$ battery charge interval according to the formula:

$$I_{avg}(i,k) = \frac{1}{N_j(i,k)} \sum_{\forall j \in i,k} I_j$$

where $I_j$ is the battery charging current supplied to the battery corresponding to the $j^{th}$ historical battery charge data point, $\forall j \in i, k$ indicates that the summation should be performed over all of the historical battery charge data points in the $k^{th}$ battery charge range in the $i^{th}$ battery charge interval, and $N_j(i,k)$ is the total number of historical battery charge data points in the $k^{th}$ battery charge range in the $i^{th}$ battery charge interval.

The method may comprise determining, for each unique battery charge range, the total charge $\Delta Q(i,k)$ supplied to the battery over the $k^{th}$ battery charge range in the $i^{th}$ battery charge interval by integrating the charging current supplied to the battery over the unique battery charge range.

The method may comprise determining, for each unique battery charge range, the total charge $\Delta Q(i,k)$ supplied to the battery over the $k^{th}$ battery charge range in the $i^{th}$ battery charge interval according to:

$$\Delta Q(i,k) = \sum_{\forall j \in i,k} \Delta t_j \cdot I_j$$

where $$\Delta t_j = \frac{1}{2}(t_{j+1} - t_{j-1})$$

where $t_j$ is the relative time value or time stamp corresponding to the $j^t$ historical battery charge data point, where $I_j$ is the battery charging current supplied to the battery corresponding to the $j^{th}$ historical battery charge data point and where $\forall j \in i,k$ indicates that the summation should be performed over all of the historical battery charge data points in the $k^{th}$ battery charge range in the $i^{th}$ battery charge interval.

According to an aspect or an embodiment of the present disclosure there is provided an apparatus configured to implement the method.

According to an aspect or an embodiment of the present disclosure there is provided an apparatus for determining a wear value of a battery of a mobile electronic device, the apparatus comprising a processor and a memory, wherein the memory stores a computer program defining the method and the processor is configured to execute the program so as to implement the method.

The memory may be configured to store the determined wear value.

The apparatus may comprise a display, wherein the display is configured to display the determined wear value of the battery determined according to the method. The processor may be configured to execute the program so as to store the determined wear value in a memory of the mobile electronic device.

The processor may be configured to execute the program so as to display the determined wear value on a display of the mobile electronic device.

The processor may be configured to execute the program so as to communicate the determined wear value to a further apparatus for storage in a memory thereof or display on a display thereof.

The apparatus may be separate from, independent of, and/or remote from, the mobile electronic device.

The apparatus may be configured to communicate with the mobile electronic device.

The apparatus may be configured to communicate with the mobile electronic device over a USB interface such as a USB cable.

According to an aspect or an embodiment of the present disclosure there is provided a computer program which, when executed by a processor, is configured to implement the method.

According to an aspect or an embodiment of the present disclosure there is provided a data storage medium including the computer program.

BRIEF DESCRIPTION OF THE DRAWINGS

An apparatus and a method for determining a wear value of a battery of a mobile electronic device will now be described by way of non-limiting example only with reference to the accompanying drawings of which.

DETAILED DESCRIPTION OF THE DRAWINGS

Figure 1:
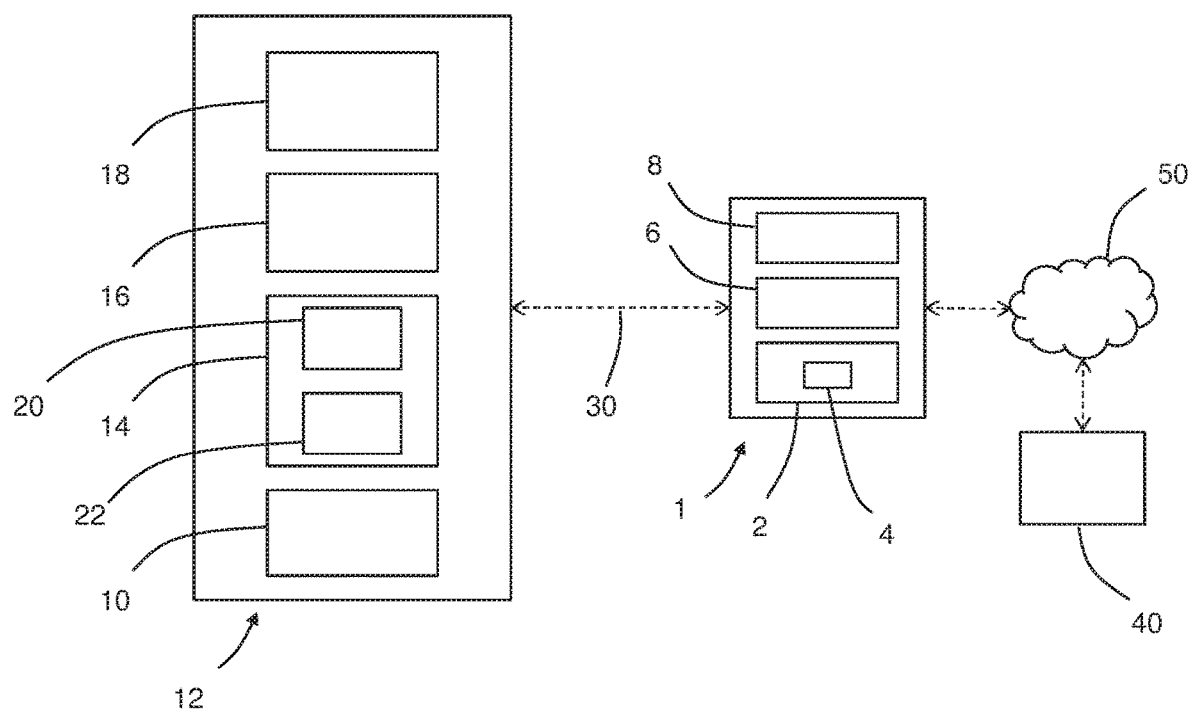
FIG. 1 shows a mobile electronic device and an apparatus for determining a wear value of a battery of the mobile electronic device.

Referring initially to FIG. 1 there is shown an apparatus generally designated 1 for determining a wear value of a battery 10 of a mobile electronic device generally designated 12 which may be an Android mobile electronic device such as a Samsung phone.

The apparatus 1 includes a memory 2, a computer program 4 stored in the memory 2, a processor 6 which is configured to execute the computer program 4, and a display 8.

In addition to the battery 10, the mobile electronic device 12 includes a memory 14, a processor 16, and a display 18. The mobile electronic device 12 further includes an Android operating system 20 and historical battery status data of the battery 10 in the form of a battery stats log file 22 stored in the memory 14.

The apparatus 1 and the mobile electronic device 12 are configured for communication via a communication link 30 such as a USB communication link or cable.

In use, the processor 6 of the apparatus 1 executes the computer program 4 to implement a method of determining a wear value for the battery 10 of the mobile electronic device 12 based upon the battery stats log file 22. Specifically, the processor 6 of the apparatus 1 communicates with the processor 16 of the mobile electronic device 12 via the communication link 30 to access and retrieve the battery stats log file 22 from the memory 14 of the mobile electronic device 12. As will be described in more detail below, the processor 6 of the apparatus 1 then determines the wear value for the battery 10 of the mobile electronic device 12 based upon the data contained in the battery stats log file 22. The processor 6 displays the wear value for the battery 10 in the display 8 of the apparatus 1. Additionally or alternatively, the processor 6 may store the wear value for the battery 10 in the memory 2 of the apparatus 1, display the wear value for the battery 10 in the display 18 of the mobile electronic device 12 and/or store the wear value for the battery 10 in the memory 14 of the mobile electronic device 12. Additionally or alternatively, the processor 6 may communicate the wear value for the battery 10 to a further apparatus 40 such as a central database for example over the Internet 50.

Figure 2:
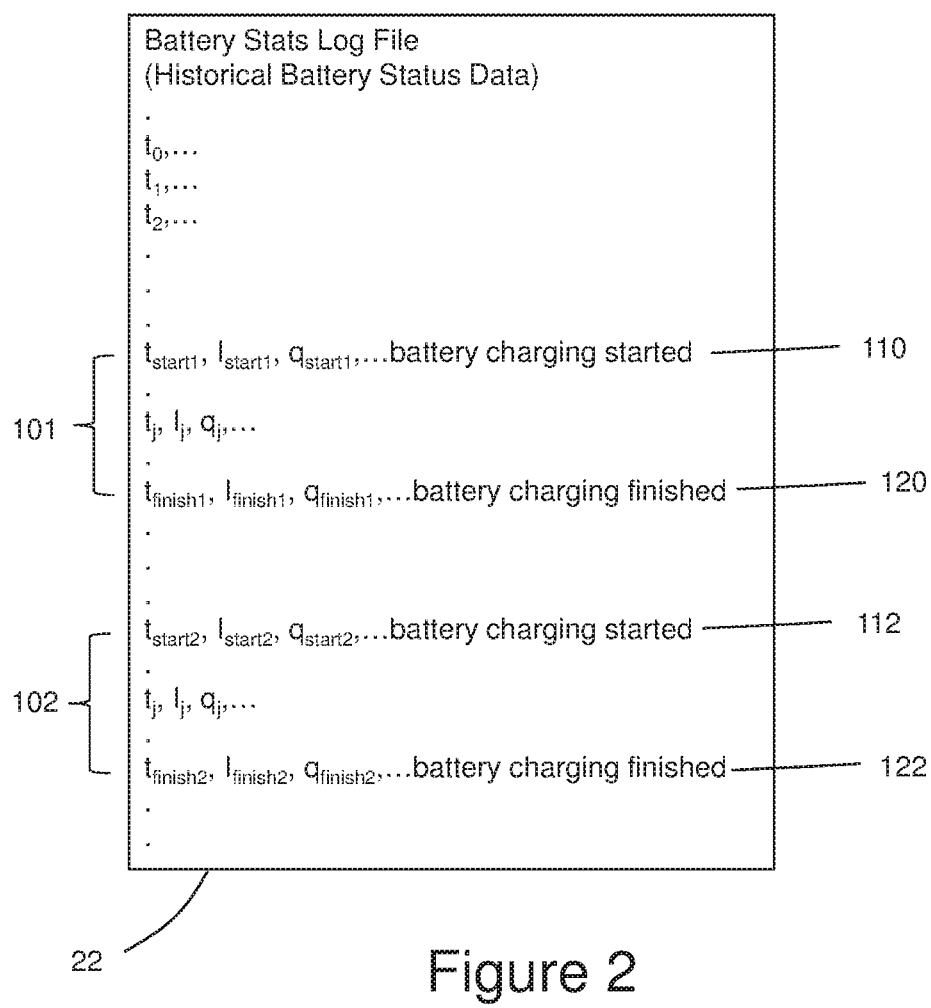
FIG. 2 shows a generic example of a battery stats log file of the mobile electronic device of FIG. 1.

FIG. 2 shows an example of a generic battery stats log file 22 which includes historical battery status data including a first set of historical battery charge data points corresponding to a first battery charge interval 101 and a second set of historical battery charge data points corresponding to a second battery charge interval 102.

Each historical battery charge data point of the first battery charge interval 101 comprises time information and corresponding battery charging current and battery charge information. The time information takes the form of relative time values or time stamps expressed as a date and a time in hours, minutes and seconds, $t_{start1}, \ldots, t_j, \ldots t_{finish1}$. The battery charging current information comprises an absolute value of charging current expressed in mA, $I_{start1}, \ldots I_j, \ldots I_{finish1}$ supplied to the battery at each time $t_{start1}, \ldots t_j, \ldots t_{finish1}$ respectively. The battery charge information comprises a fractional value $q_{start1}, \ldots, q_j, \ldots q_{finish1}$ of the actual charge capacity $Q_{act}$ of the battery expressed as a fraction or percentage of the actual charge capacity $Q_{act}$ of the battery at each time $t_{start1}, \ldots, t_j, \ldots t_{finish1}$ respectively.

Similarly, each historical battery charge data point of the second battery charge interval 102 comprises time information and corresponding battery charging current and battery charge information. The time information takes the form of relative time values or time stamps expressed as a date and a time in hours, minutes and seconds, $t_{start2}, \ldots t_j, \ldots t_{finish2}$. The battery charging current information comprises an absolute value of charging current expressed in mA, $I_{start2}, \ldots I_j, \ldots I_{finish2}$ supplied to the battery at each time $t_{start2} \ldots t_j, \ldots t_{finish2}$ respectively. The battery charge information comprises a fractional value $q_{start2}, \ldots q_j, \ldots q_{finish2}$ of the actual charge capacity $Q_{act}$ of the battery expressed as a fraction or percentage of the actual charge capacity $Q_{act}$ of the battery at each time $t_{start2}, \ldots t_j, \ldots t_{finish2}$ respectively.

The battery stats log file 22 also includes battery charging status information such as a battery charging status flags 110, 112, indicating when battery charging started, and a battery charging status flags 120, 122 indicating when battery charging finished.

One of skill in the art will understand that, an actual battery stats log file 22 may include other information not shown in FIG. 2 or that an actual battery stats log file 22 may present the historical battery status data in a different format to that shown in FIG. 2.

Figure 3:
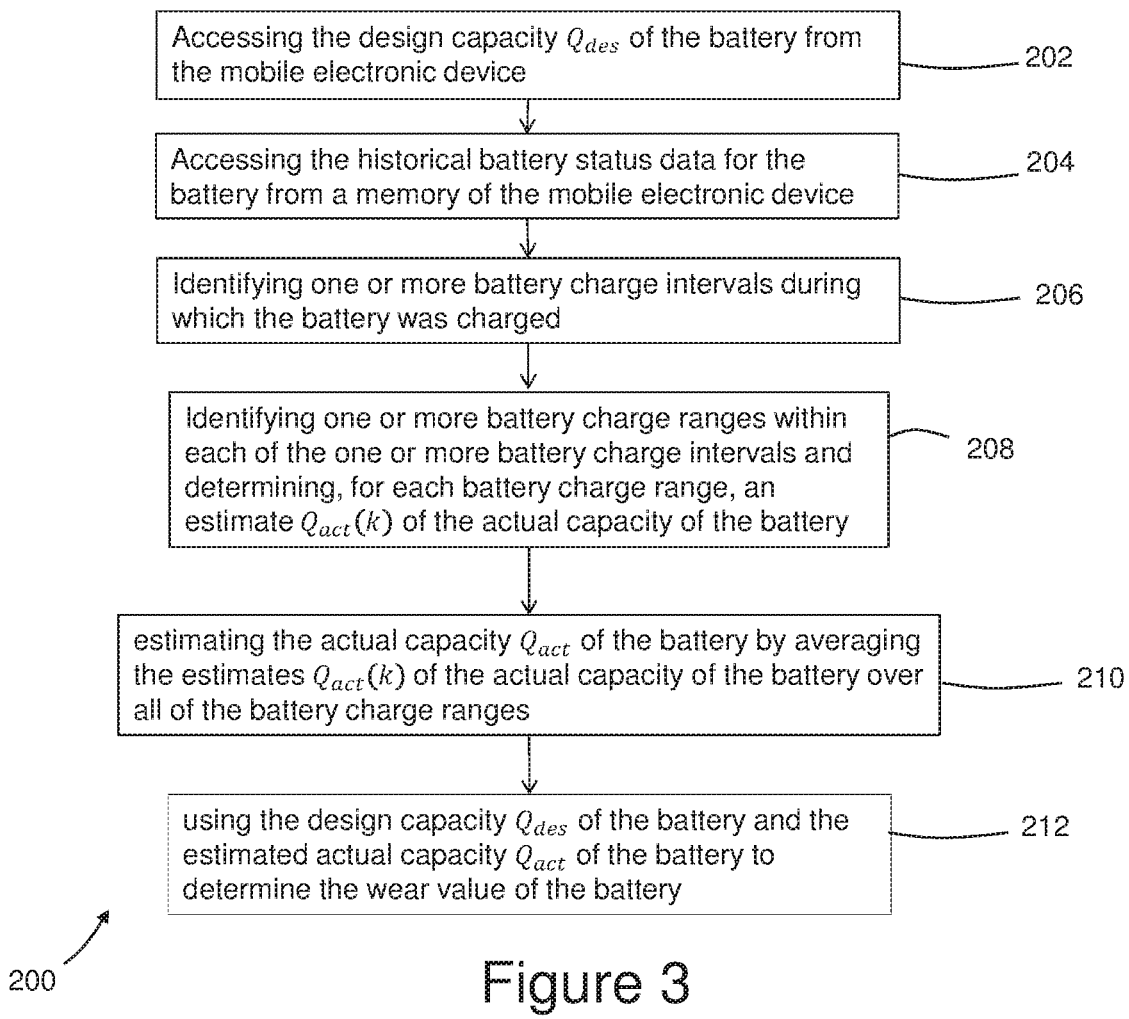
FIG. 3 shows a method for determining a wear value for a battery of the mobile electronic device of FIG. 1.

FIG. 3 shows a method 200 of determining a wear value for the battery 10 of the mobile electronic device 12. The method 200 begins at step 202 with the processor 6 of the apparatus 1 accessing the design capacity $Q_{des}$ of the battery 10 from the mobile electronic device 12. Specifically, the processor 6 deploys an app on the mobile electronic device 12 which extracts and retrieves the design capacity $Q_{des}$ of the battery from the mobile electronic device 12.

The method continues at step 204 with the processor 6 accessing the historical battery status data from the battery stats log file 22 of the mobile electronic device 12.

The method continues at step 206 with the processor 6 using the battery charging status flags 110, 112, 120, 122 to identify one or more battery charge intervals during which the battery was charged.

As will be described in more detail below, the method continues at step 208 with the processor 6 identifying one or more battery charge ranges within each of the one or more battery charge intervals and determining, for each battery charge range, an estimate $Q_{act}(k)$ of the actual charge capacity $Q_{act}$ of the battery, where k is an index assigned to each battery charge range according to the numerical order in which the fractional values of the actual capacity $Q_{act}$ of the battery in the battery charge ranges occur.

At step 210, the processor 6 estimates the actual capacity $Q_{act}$ of the battery by averaging the estimates $Q_{act}(k)$ of the actual capacity of the battery for all of the battery charge ranges according to the formula:

$$Q_{act} = \frac{1}{N_k} \sum_{\forall k} Q_{act}(k)$$

where $N_k$ is the total number of battery charge ranges. It is known that the charge behaviour of a battery of a mobile electronic device is generally non-linear and it is thought that the accuracy of the measurement of the battery charge information may vary across the full range of fractional values of the actual capacity $Q_{act}$ of the battery. Consequently, averaging the estimates $Q_{act}(k)$ of the actual capacity of the battery for all of the battery charge ranges in this way may improve the accuracy of the estimate of the actual capacity $Q_{act}$ of the battery because it may average out or reduce any variations in the accuracy of the battery charge information across the full range of fractional values of the actual capacity $Q_{act}$ of the battery. It is also thought that the accuracy of the measurement of the battery charge information may vary with usage of the mobile electronic device during charging. Averaging the estimates $Q_{act}(k)$ of the actual capacity of the battery for all of the battery charge ranges in this way, may also help to account for any variation in the accuracy of the measurement of the battery charge information with usage of the mobile electronic device during charging, thereby helping to improve the accuracy of the estimate of the actual capacity $Q_{act}$ of the battery.

At step 212, the processor 6 determines the wear value of the battery expressed as a percentage wear value $W_p$ according to the formula:

$$W_p = 100 \times \left(1 - \frac{Q_{act}}{Q_{des}}\right)$$

where $Q_{act}$ is the estimated actual capacity of the battery and $Q_{des}$ the design capacity of the battery.

Additionally or alternatively, at step 212, the processor 6 may determine the wear value of the battery expressed as a fractional wear value $W_f$ according to the formula:

$$W_f = 1 - \frac{Q_{act}}{Q_{des}}$$

where $Q_{act}$ is the estimated actual capacity of the battery and $Q_{des}$ the design capacity of the battery.

Step 208 of the method of FIG. 3 will now be described with reference to FIGS. 4 and 5. At step 220, the processor 6 identifies any common and any unique battery charge ranges. Specifically, the processor 6:

identifies any common battery charge ranges in which the fractional values of the actual capacity $Q_{act}$ of the battery of one battery charge interval overlap with the fractional values of the actual capacity $Q_{act}$ of the battery of any one or more other battery charge intervals; and identifies any unique battery charge ranges in which none of the fractional values of the actual capacity $Q_{act}$ of the battery of one battery charge interval overlap with the fractional values of the actual capacity $Q_{act}$ of the battery of any one or more other battery charge intervals.

Figure 5:
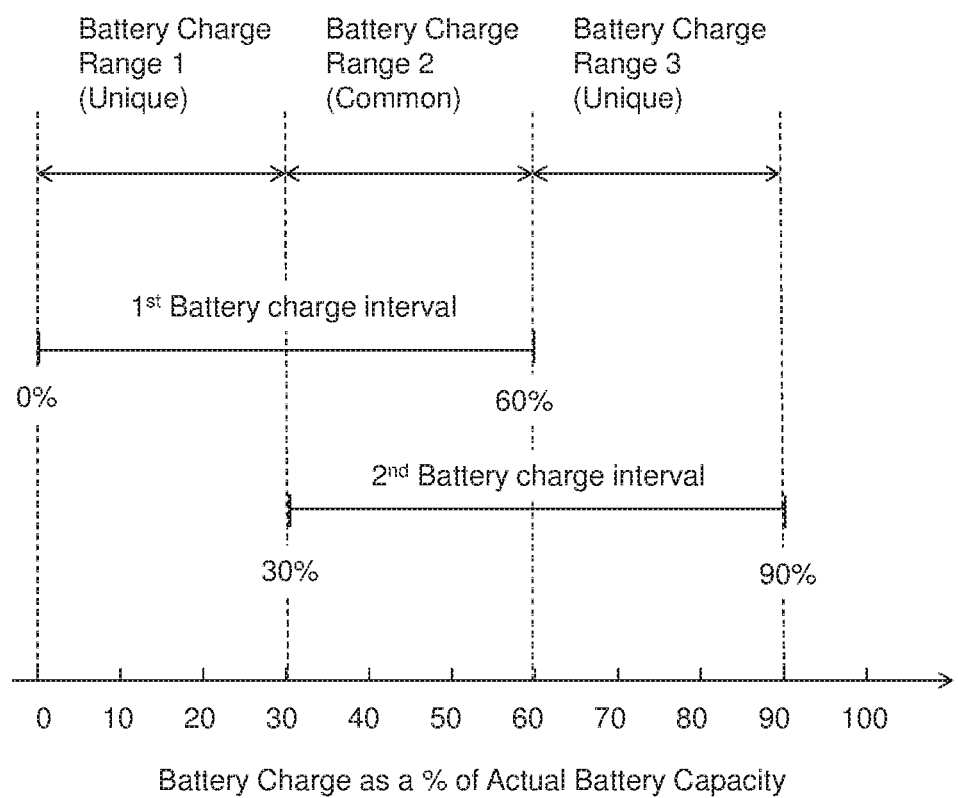
FIG. 5 shows an example of two overlapping battery charge intervals in a battery stats log file.

For example, referring to FIG. 5 there are shown two overlapping battery charge intervals: a first battery charge interval for which the fractional values of the actual capacity $Q_{act}$ of the battery range from 0% to 60% and a second battery charge interval for which the fractional values of the actual capacity $Q_{act}$ of the battery range from 30% to 90%. Accordingly, the processor 6 identifies three battery charge ranges:

i. a first battery charge range, battery charge range 1, which has fractional values of the actual capacity $Q_{act}$ of the battery ranging from 0% to 30% and which is unique to the first battery charge interval;

ii. a second battery charge range, battery charge range 2, which has fractional values of the actual capacity $Q_{act}$ of the battery ranging from 30% to 60% and which is common to the first and second battery charge intervals; and iii. a third battery charge range, battery charge range 3, which has fractional values of the actual capacity $Q_{act}$ of the battery ranging from 60% to 90% and which is unique to the second battery charge interval.

Referring back to FIG. 4, the method continues at step 222 with the processor 6 determining, for each common battery charge range (e.g. battery charge range 2 of FIG. 5) and for each battery charge interval to which the common battery charge range is common (e.g. the first and second battery charge intervals of FIG. 5), an estimate $Q_{act}(i,k)$ of the actual capacity of the battery according to the formula:

$$Q_{act}(i,k) = \Delta Q(i,k) \times 100[p_{final}(i,k) - p_{initial}(i,k)]$$

where $p_{initial}(i,k)$ is the initial fractional value of the actual capacity of the battery expressed as a percentage at the beginning of the $k^{th}$ battery charge range in the $i^{th}$ battery charge interval;

where $p_{final}(i,k)$ is the final fractional value of the actual capacity of the battery expressed as a percentage at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

For the example shown in FIG. 5, there is only one common battery charge range, namely battery charge range 2, and two battery charge intervals, namely the first and second battery charge intervals. Accordingly, step 222 results in the processor 6 determining:

$p_{initial}(1,2) = 30$ and $p_{final}(1,2) = 60$; and $p_{initial}(2,2) = 30$ and $p_{final}(2,2) = 60$.

The processor 6 also determines, for each common battery charge range (e.g. battery charge range 2 of FIG. 5) and for each battery charge interval to which the common battery charge range is common (e.g. the first and second battery charge intervals of FIG. 5), the total charge $\Delta Q(i,k)$ supplied to the battery over the $k^{th}$ battery charge range in the $i^{th}$ battery charge interval according to:

$$\Delta Q(i,k) = I_{avg}(i,k) \times T(i,k)$$

where $I_{avg}(i,k)$ is the average battery charging current supplied to the battery over the $k^{th}$ battery charge range in the $i^{th}$ battery charge interval, and $T(i,k)$ is the duration of the $k^{th}$ battery charge range in the $i^{th}$ battery charge interval determined according to the formula:

$$T(i,k) = t_{final}(i,k) - t_{initial}(i,k)$$

where $t_{initial}(i,k)$ is the relative time value or time stamp corresponding to the first battery charge data point of the $k^{th}$ battery charge range in the $i^{th}$ battery charge interval, and $t_{final}(i,k)$ is the relative time value or time stamp corresponding to the last battery charge data point of the $k^{th}$ battery charge range in the $i^{th}$ battery charge interval.

For the example shown in FIG. 5, there is only one common battery charge range, namely battery charge range 2. Accordingly, for the example shown in FIG. 5, the processor 6 determines:

$$\Delta Q(1,2) = I_{avg}(1,2) \times T(1,2)$$

$$\Delta Q(2,2) = I_{avg}(2,2) \times T(2,2)$$

where:
- $I_{avg}(1,2)$ is the average current determined for battery charge range 2 from the battery charging data in the first battery charge interval;
- $T(1,2)$ is the duration associated with battery charge range 2 from the time data in the first battery charge interval;
- $I_{avg}(2,2)$ is the average current determined for battery charge range 2 from the battery charging data in the second battery charge interval; and
- $T(2,2)$ is the duration associated with battery charge range 2 from the time data in the second battery charge interval.

The processor 6 determines, for each common battery charge range and for each battery charge interval to which the common battery charge range is common, the average battery charging current $I_{avg}(i,k)$ supplied to the battery over the $k^{th}$ battery charge range in the $i^{th}$ battery charge interval according to the formula:

$$I_{avg}(i,k) = \frac{1}{N_j(i,k)} \sum_{\forall j \in i,k} I_j$$

where $I_j$ is the battery charging current supplied to the battery corresponding to the $j^{th}$ historical battery charge data point, $\forall j \in i,k$ indicates that the summation should be performed over all of the historical battery charge data points in the $k^{th}$ battery charge range in the $i^{th}$ battery charge interval, and $N_j(i,k)$ is the total number of historical battery charge data points in the $k^{th}$ battery charge range in the $i^{th}$ battery charge interval.

For the example shown in FIG. 5, there is only one common battery charge range, namely battery charge range 2, and two battery charge intervals, namely the first and second battery charge intervals. The processor 6 determines the average battery charging current $I_{avg}(1,2)$ supplied to the battery over battery charge range 2 in the first battery charge interval according to the formula:

$$I_{avg}(1,2) = \frac{1}{N_j(1,2)} \sum_{\forall j \in i=1, k=2} I_j$$

where $I_j$ is the battery charging current supplied to the battery corresponding to the $j^{th}$ historical battery charge data point, $\forall j \in i=1, k=2$ indicates that the summation should be performed over all of the historical battery charge data points in battery charge range 2 in the $1^{st}$ battery charge interval, and $N_j(1,2)$ is the total number of historical battery charge data points in battery charge range 2 in the $1^{st}$ battery charge interval.

Similarly, the processor 6 determines the average battery charging current $I_{avg}(1,2)$ supplied to the battery over battery charge range 2 in the second battery charge interval according to the formula:

$$I_{avg}(2,2) = \frac{1}{N_j(2,2)} \sum_{\forall j \in i=2, k=2} I_j$$

where $I_j$ is the battery charging current supplied to the battery corresponding to the $j^{th}$ historical battery charge data point, $\forall j \in i=2, k=2$ indicates that the summation should be performed over all of the historical battery charge data points in battery charge range 2 in the $2^{nd}$ battery charge interval, and $N_j(2,2)$ is the total number of historical battery charge data points in battery charge range 2 in the $2^{nd}$ battery charge interval.

Figure 4:
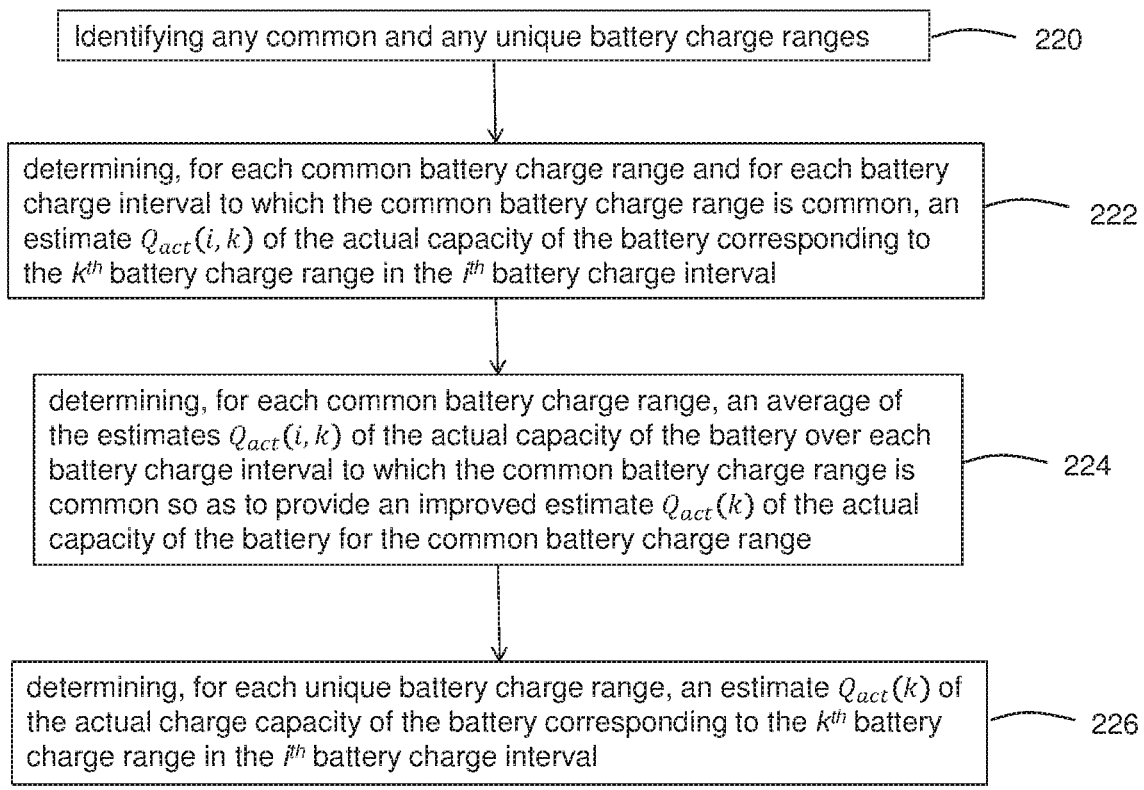
FIG. 4 shows step 208 of the method of FIG. 3 in more detail.

As shown in FIG. 4, the method continues at step 224 with the processor 6 determining, for each common battery charge range, an average of the estimates $Q_{act}(i,k)$ of the actual capacity of the battery over each battery charge interval to which the common battery charge range is common so as to provide an improved estimate $Q_{act}(k)$ of the actual capacity $Q_{act}$ of the battery for the $k^{th}$ battery charge range according to the formula:

$$Q_{act}(k) = \frac{1}{N_{icom}(k)} \sum_{\forall i \in i_{com}} Q_{act}(i,k)$$

where $\forall i \in i_{com}$ indicates that the summation should be performed over all of the battery charge intervals to which the $k^{th}$ battery charge range is common and $N_{icom}(k)$ is the number of battery charge intervals to which the $k^{th}$ battery charge range is common. Averaging the estimates of the actual capacity of the battery in this way across each battery charge interval to which each common battery charge range is common, may help to account for any variation in the usage of the mobile electronic device during charging in the common battery charge range in different battery charge intervals, thereby helping to improve the accuracy of the estimate of the actual capacity of the battery.

For the example shown in FIG. 5, there is only one common battery charge range, namely battery charge range 2, and two battery charge intervals. Accordingly, for the example shown in FIG. 5 at step 224 the processor 6 simply averages the estimates $Q_{act}(1,2)$ and $Q_{act}(2,2)$ to determine an estimate of the actual capacity of the battery for battery charge range 2 according to the formula:

$$Q_{act}(2) = \frac{1}{2} \sum_{i=1,2} Q_{act}(i,2)$$

Averaging the estimates of the actual capacity of the battery 10 in this way over a battery charge range for different battery charge intervals, helps to account for any variation in the usage of the mobile electronic device 12 during charging, thereby helping to improve the accuracy of the estimate of the actual capacity of the battery 10.

At step 226 of FIG. 4, the processor 6 determines, for each unique battery charge range, an estimate $Q_{act}(k)$ of the actual capacity of the battery according to the formula:

$$Q_{act}(k) = \Delta Q(i,k) \times 100/[p_{final}(i,k) - p_{initial}(i,k)]$$

where $p_{initial}(i,k)$ is the initial fractional value of the actual capacity of the battery expressed as a percentage at the beginning of the $k^{th}$ battery charge range in the $i^{th}$ battery charge interval;

where $p_{final}(i,k)$ is the final fractional value of the actual capacity of the battery expressed as a percentage at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

For the example of FIG. 5 there are two unique battery charge ranges, namely battery charge ranges 1 and 3. Accordingly step 226 results in the processor 6 determining:

$p_{initial}(1,1)=0$ and $p_{final}(1,1)=30$; and $p_{initial}(2,3)=60$ and $p_{final}(2,3)=90$.

The processor 6 also determines, for each unique battery charge range, the total charge $\Delta Q(k)$ supplied to the battery over the $k^{th}$ battery charge range in the $i^{th}$ battery charge interval according to:

$$\Delta Q(k) = I_{avg}(i,k) \times T(i,k)$$

where $I_{avg}(i,k)$ is the average battery charging current supplied to the battery over the $k^{th}$ battery charge range in the $i^{th}$ battery charge interval, and $T(i,k)$ is the duration of the $k^{th}$ battery charge range in the $i^{th}$ battery charge interval determined according to the formula:

$$T(i,k) = t_{final}(i,k) - t_{initial}(i,k)$$

where $t_{initial}(i,k)$ is the relative time value or time stamp corresponding to the first battery charge data point of the $k^{th}$ battery charge range in the $i^{th}$ battery charge interval, and $t_{final}(i,k)$ is the relative time value or time stamp corresponding to the last battery charge data point of the $k^{th}$ battery charge range in the $i^{th}$ battery charge interval.

For the example shown in FIG. 5, there are two unique battery charge ranges, namely battery charge ranges 1 and 3. Accordingly, for the example shown in FIG. 5, the processor 6 determines the total charge $\Delta Q(1)$ supplied to the battery over battery charge range 1 in the $1^{st}$ battery charge interval according to:

$$\Delta Q(1) = I_{avg}(1,1) \times T(1,1)$$

and the total charge $\Delta Q(3)$ supplied to the battery over battery charge range 3 in the $2^{nd}$ battery charge interval according to:

$$\Delta Q(3) = I_{avg}(2,3) \times T(2,3)$$

The processor 6 determines, for each unique battery charge range, the average battery charging current $I_{avg}(i,k)$ supplied to the battery over the $k^{th}$ battery charge range in the $i^{th}$ battery charge interval according to the formula:

$$I_{avg}(i, k) = \frac{1}{N_j(i, k)} \sum_{\forall j \in i,k} I_j$$

where $I_j$ is the battery charging current supplied to the battery corresponding to the $j^{th}$ historical battery charge data point, $\forall j \in i,k$ indicates that the summation should be performed over all of the historical battery charge data points in the $k^{th}$ battery charge range in the $i^{th}$ battery charge interval, and $N_j(i,k)$ is the total number of historical battery charge data points in the $k^{th}$ battery charge range in the $i^{th}$ battery charge interval.

For the example shown in FIG. 5, there are two unique battery charge ranges, namely battery charge ranges 1 and 3, wherein battery charge range 1 is unique to the first battery charge interval and battery charge range 3 is unique to the second battery charge interval. The processor 6 determines, for unique battery charge range 1, the average battery charging current $I_{avg}(1,1)$ supplied to the battery over battery charge range 1 in the first battery charge interval according to the formula:

$$I_{avg}(1, 1) = \frac{1}{N_j(1, 1)} \sum_{\forall j \in i=1, k=1} I_j$$

where $I_j$ is the battery charging current supplied to the battery corresponding to the $j^{th}$ historical battery charge data point, $\forall j \in i=1, k=1$ indicates that the summation should be performed over all of the historical battery charge data points in battery charge range 1 in the $1^{st}$ battery charge interval, and $N_j(1,1)$ is the total number of historical battery charge data points in battery charge range 1 in the $1^{st}$ battery charge interval.

Similarly, the processor 6 determines, for unique battery charge range 3, the average battery charging current $I_{avg}(2,3)$ supplied to the battery over battery charge range 3 in the second battery charge interval according to the formula:

$$I_{avg}(2, 3) = \frac{1}{N_j(2, 3)} \sum_{\forall j \in i=2, k=3} I_j$$

where $I_j$ is the battery charging current supplied to the battery corresponding to the $j^{th}$ historical battery charge data point, $\forall j \in i=2, k=3$ indicates that the summation should be performed over all of the historical battery charge data points in battery charge range 3 in the $2^{nd}$ battery charge interval, and $N_j(2,3)$ is the total number of historical battery charge data points in battery charge range 3 in the $2^{nd}$ battery charge interval.

Returning to step 210 shown in FIG. 3, for the example of FIG. 5, the processor 6 estimates the actual capacity $Q_{act}$ of the battery by averaging the estimates $Q_{act}(k)$ of the actual capacity of the battery for all of the battery charge ranges $k=1, 2$ and $3$ according to the formula:

$$Q_{act} = \frac{1}{3} \sum_{k=1,2,3} Q_{act}(k)$$

It is known that the charge behaviour of the battery 10 of the mobile electronic device 12 is generally non-linear and it is thought that the accuracy of the measurement of the battery charge information may vary across the full range of fractional values of the actual capacity $Q_{act}$ of the battery. Consequently, averaging the estimates $Q_{act}(k)$ of the actual capacity of the battery 10 for all of the battery charge ranges in this way may improve the accuracy of the estimate of the actual capacity $Q_{act}$ of the battery 10 because it may average out or reduce any variations in the accuracy of the battery charge information across the full range of fractional values of the actual capacity $Q_{act}$ of the battery. It is also thought that the accuracy of the measurement of the battery charge information may vary with usage of the mobile electronic device during charging. Averaging the estimates $Q_{act}(k)$ of the actual capacity of the battery 10 for all of the battery charge ranges in this way, may also help to account for any variation in the accuracy of the measurement of the battery charge information with usage of the mobile electronic device 12 during charging, thereby helping to improve the accuracy of the estimate of the actual capacity $Q_{act}$ of the battery 10.

One of ordinary skill in the art will appreciate that the apparatus and methods described above may be modified without departing from the scope of the present invention as defined by the appended claims. For example, if the fractional values of the actual capacity of the battery are expressed as fractions, the processor 6 may determine, for each common battery charge range and for each battery charge interval to which the common battery charge range is common, an estimate $Q_{act}(i,k)$ of the actual capacity of the battery according to the formula:

$$Q_{act}(i,k)=\Delta Q(i,k)/[f_{final}(i,k)-f_{initial}(i,k)]$$

where $f_{initial}(i,k)$ is the initial fractional value of the actual capacity of the battery expressed as a fraction at the beginning of the $k^{th}$ battery charge range in the $i^{th}$ battery charge interval;

where $f_{final}(i,k)$ is the final fractional value of the actual capacity of the battery expressed as a fraction at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

Similarly, if the fractional values of the actual capacity of the battery are expressed as fractions, the processor 6 may determine, for each unique battery charge range, an estimate $Q_{act}(k)$ of the actual capacity of the battery according to the formula:

$$Q_{act}(k)=\Delta Q(i,k)/[f_{final}(i,k)-f_{initial}(i,k)]$$

where $f_{initial}(i,k)$ is the initial fractional value of the actual capacity of the battery expressed as a fraction at the beginning of the $k^{th}$ battery charge range in the $i^{th}$ battery charge interval;

where $f_{final}(i,k)$ is the final fractional value of the actual capacity of the battery expressed as a fraction at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

Figure 6:
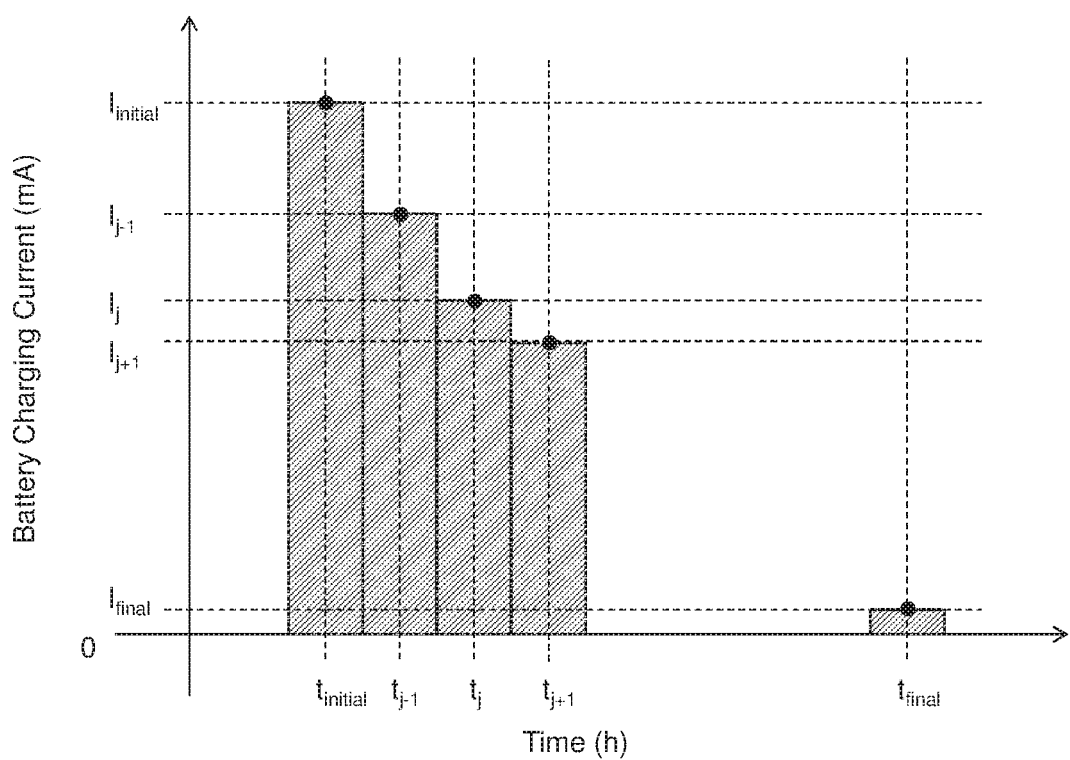
FIG. 6 is a schematic of battery charging current versus time over a batterycharge range in a battery charge interval.

Rather than determining an average current for each common battery charge range and for each battery charge interval to which the common battery charge range is common and using the average current to determine the total charge $\Delta Q(i,k)$ supplied to the battery over the $k^{th}$ battery charge range in the $i^{th}$ battery charge interval, the processor 6 may determine, for each common battery charge range and for each battery charge interval to which the common battery charge range is common, the total charge $\Delta Q(i,k)$ supplied to the battery over the $k^{th}$ battery charge range in the $i^{th}$ battery charge interval by integrating the charging current supplied to the battery over the common battery charge range in the battery charge interval. For example, with reference to FIG. 6, the processor 6 may determine, for each common battery charge range and for each battery charge interval to which the common battery charge range is common, the total charge $\Delta Q(i,k)$ supplied to the battery over the $k^{th}$ battery charge range in the $i^{th}$ battery charge interval according to:

$$\Delta Q(i, k) = \sum_{\forall j \in i,k} \Delta t_j \cdot I_j$$

Where $$\Delta t_j = \frac{1}{2}(t_{j+1} - t_{j-1})$$

where $t_j$ is the relative time value or time stamp corresponding to the $j^{th}$ historical battery charge data point, where $I_j$ is the battery charging current supplied to the battery corresponding to the $j^{th}$ historical battery charge data point and where $\forall j \in i,k$ indicates that the summation should be performed over all of the historical battery charge data points in the $k^{th}$ battery charge range in the $i^{th}$ battery charge interval.

Similarly, rather than determining an average current for each unique battery charge range and using the average current to determine the total charge $\Delta Q(i,k)$ supplied to the battery over the $k^{th}$ battery charge range in the $i^{th}$ battery charge interval, the processor 6 may determine, for each unique battery charge range, the total charge $\Delta Q(i,k)$ supplied to the battery over the $k^{th}$ battery charge range in the $i^{th}$ battery charge interval by integrating the charging current supplied to the battery over the unique battery charge range. For example, with reference to FIG. 6, the processor 6 may determine, for each unique battery charge range, the total charge $\Delta Q(i,k)$ supplied to the battery over the $k^{th}$ battery charge range in the $i^{th}$ battery charge interval according to:

$$\Delta Q(i, k) = \sum_{\forall j \in i,k} \Delta t_j \cdot I_j$$

where $$\Delta t_j = \frac{1}{2}(t_{j+1} - t_{j-1})$$

where $t_j$ is the relative time value or time stamp corresponding to the $j^{th}$ historical battery charge data point, where $I_j$ is the battery charging current supplied to the battery corresponding to the $j^{th}$ historical battery charge data point and where $\forall j \in i,k$ indicates that the summation should be performed over all of the historical battery charge data points in the $k^{th}$ battery charge range in the $i^{th}$ battery charge interval.

Although FIG. 5 shows two battery charge intervals, one of ordinary skill in the art will understand that the number of battery charge intervals may be greater or fewer than two. Similarly, although FIG. 5 shows one common battery charge range 2 and two unique battery charge ranges 1 and 2, one of ordinary skill in the art will understand that the number of common battery charge ranges may be greater or less than one and that the number of unique battery charge ranges may be greater or less than two.

The invention claimed is:

1. A method for determining a wear value of a battery of a mobile electronic device, the method comprising:
   using historical battery status data to estimate an actual capacity $Q_{act}$ of the battery;
   using a design capacity $Q_{des}$ of the battery and the estimated actual capacity $Q_{act}$ of the battery to determine the wear value of the battery;
   wherein:
   the historical battery status data comprises time information and battery charging status information, further comprising using the time information and the battery charging status information to identify one or more battery charge intervals during which the battery was charged and identifying one or more battery charge ranges within each of the one or more battery charge intervals;

the historical battery status data comprises a plurality of historical battery charge data points for each battery charge interval, wherein each historical battery charge data point comprises time information, battery charging current information, and battery charge information;

the time information may comprise a relative time value or time stamp;

the battery charging current information may comprise a value of charging current supplied to the battery; and the battery charge information may comprise a fractional value of the actual capacity $Q_{act}$ of the battery, expressed as a fraction or as a percentage of the actual capacity $Q_{act}$ of the battery; and the method further comprising:

determining, for each battery charge range, an estimate $Q_{act}(k)$ of the actual charge capacity $Q_{act}$ of the battery, where k is an index assigned to each battery charge range according to the numerical order in which the fractional values of the actual capacity $Q_{act}$ of the battery in the battery charge ranges occur;

identifying any common battery charge ranges in which the fractional values of the actual capacity $Q_{act}$ of the battery of one battery charge interval overlap with the fractional values of the actual capacity $Q_{act}$ of the battery of any one or more other battery charge intervals; and identifying any unique battery charge ranges in which none of the fractional values of the actual capacity $Q_{act}$ of the battery of one battery charge interval overlap with the fractional values of the actual capacity $Q_{act}$ of the battery of any one or more other battery charge intervals.

2. The method according to claim 1, comprising accessing the design capacity $Q_{des}$ of the battery from the mobile electronic device.

3. The method according to claim 1, comprising deploying an app on the mobile electronic device to extract the design capacity $Q_{des}$ of the battery from the mobile electronic device.

4. The method according to claim 1, comprising accessing the historical battery status data for the battery from a memory of the mobile electronic device.

5. The method according to claim 1, comprising accessing the historical battery status data for the battery from a battery stats log file of the mobile electronic device.

6. The method according to claim 1, wherein at least one of:

the mobile electronic device comprises or runs an Android operating system; or the mobile electronic device comprises a phone.

7. The method according to claim 1, comprising displaying the wear value of the battery.

8. The method according to claim 1, comprising storing the wear value of the battery.

9. The method according to claim 1, comprising estimating the actual capacity $Q_{act}$ of the battery by averaging the estimates $Q_{act}(k)$ of the actual capacity of the battery for all of the battery charge ranges according to the formula:

$$Q_{act} = \frac{1}{N_k} \sum_{\forall k} Q_{act}(k)$$

where $N_k$ is the total number of battery charge ranges.

10. The method according to claim 9, comprising determining the wear value of the battery expressed as a percentage wear value $W_p$ according to the formula:

$$W_p = 100 \times \left(1 - \frac{Q_{act}}{Q_{des}}\right)$$

or determining the wear value of the battery expressed as a fractional wear value $W_f$ according to the formula:

$$W_f = 1 - \frac{Q_{act}}{Q_{des}}$$

where $Q_{act}$ is the estimated actual capacity of the battery and $Q_{des}$ the design capacity of the battery.

11. The method according to claim 1, comprising determining, for each common battery charge range and for each battery charge interval to which the common battery charge range is common, an estimate $Q_{act}(i,k)$ of the actual capacity of the battery according to the formula:

$$Q_{act}(i,k) = \Delta Q(i,k) \times 100 / [p_{final}(i,k) - p_{initial}(i,k)]$$

where $p_{initial}(i,k)$ is the initial fractional value of the actual capacity of the battery expressed as a percentage at the beginning of the $k^{th}$ battery charge range in the $i^{th}$ battery charge interval;

where $p_{final}(i,k)$ is the final fractional value of the actual capacity of the battery expressed as a percentage at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

12. The method according to claim 11, comprising determining, for each common battery charge range and for each battery charge interval to which the common battery charge range is common, the total charge $\Delta Q(i,k)$ supplied to the battery over the $k^{th}$ battery charge range in the $i^{th}$ battery charge interval.

13. The method according to claim 12, comprising determining, for each common battery charge range and for each battery charge interval to which the common battery charge range is common, the total charge $\Delta Q(i,k)$ supplied to the battery over the $k^{th}$ battery charge range in the $i^{th}$ battery charge interval according to:

$$\Delta Q(i,k) = I_{avg}(i,k) \times T(i,k)$$

where $I_{avg}(i,k)$ is the average battery charging current supplied to the battery over the $k^{th}$ battery charge range in the $i^{th}$ battery charge interval, and $T(i,k)$ is the duration of the $k^{th}$ battery charge range in the $i^{th}$ battery charge interval determined according to the formula:

$$T(i,k) = t_{final}(i,k) - t_{initial}(i,k)$$

where $t_{initial}(i,k)$ is the relative time value or time stamp corresponding to the first battery charge data point of $k^{th}$ battery charge range in the $i^{th}$ battery charge interval, and $t_{final}(i,k)$ is the relative time value or time stamp corresponding to the last battery charge data point of the $k^{th}$ battery charge range in the $i^{th}$ battery charge interval.

14. The method according to claim 11, comprising determining, for each common battery charge range, an average of the estimates $Q_{act}(i,k)$ of the actual capacity of the battery over each battery charge interval to which the common battery charge range is common so as to provide an improved estimate $Q_{act}(k)$ of the actual capacity $Q_{act}$ of the battery for the $k^{th}$ battery charge range according to the formula:

$$Q_{act}(k) = \frac{1}{N_{icom}(k)} \sum_{\forall i \in i_{com}} Q_{act}(i,k)$$

where $\forall i \in i_{com}$ indicates that the summation should be performed over all of the battery charge intervals to which the $k^{th}$ battery charge range is common and $N_{icom}(k)$ is the number of battery charge intervals to which the $k^{th}$ battery charge range is common.

15. The method according to claim 1, comprising determining, for each common battery charge range and for each battery charge interval to which the common battery charge range is common, an estimate $Q_{act}(i,k)$ of the actual capacity of the battery according to the formula:

$$Q_{act}(i,k) = \Delta Q(i,k)/[f_{final}(i,k) - f_{initial}(i,k)]$$

where $f_{initial}(i,k)$ is the initial fractional value of the actual capacity of the battery expressed as a fraction at the beginning of the $k^{th}$ battery charge range in the $i^{th}$ battery charge interval;

where $f_{final}(i,k)$ is the final fractional value of the actual capacity of the battery expressed as a fraction at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

16. The method according to claim 1, comprising determining, for each unique battery charge range, an estimate $Q_{act}(k)$ of the actual capacity of the battery according to the formula:

$$Q_{act}(k) = \Delta Q(i,k)/[f_{final}(i,k) - f_{initial}(i,k)]$$

where $f_{initial}(i,k)$ is the initial fractional value of the actual capacity of the battery expressed as a fraction at the beginning of the $k^{th}$ battery charge range in the $i^{th}$ battery charge interval;

where $f_{final}(i,k)$ is the final fractional value of the actual capacity of the battery expressed as a fraction at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

17. The method according to claim 16, comprising determining, for each unique battery charge range, the total charge $\Delta Q(i,k)$ supplied to the battery over the $k^{th}$ battery charge range in the $i^{th}$ battery charge interval.

18. The method according to claim 17, comprising determining, for each unique battery charge range, the total charge $\Delta Q(i,k)$ supplied to the battery over the $k^{th}$ battery charge range in the $i^{th}$ battery charge interval according to:

$$\Delta Q(i,k) = I_{avg}(i,k) \times T(i,k)$$

where $I_{avg}(i,k)$ is the average battery charging current supplied to the battery over the $k^{th}$ battery charge range in the $i^{th}$ battery charge interval, and $T(i,k)$ is the duration of the $k^{th}$ battery charge range in the $i^{th}$ battery charge interval determined according to the formula:

$$T(i,k) = t_{final}(i,k) - t_{initial}(i,k)$$

where $t_{initial}(i,k)$ is the relative time value or time stamp corresponding to the first battery charge data point of the $k^{th}$ battery charge range in the $i^{th}$ battery charge interval, and $t_{final}(i,k)$ is the relative time value or time stamp corresponding to the last battery charge data point of the $k^{th}$ battery charge range in the $i^{th}$ battery charge interval.

19. The method according to claim 1, comprising determining, for each unique battery charge range, an estimate $Q_{act}(k)$ of the actual capacity of the battery according to the formula:

$$Q_{act}(k) = \Delta Q(i,k) \times 100/[p_{final}(i,k) - p_{initial}(i,k)]$$

where $p_{initial}(i,k)$ is the initial fractional value of the actual capacity of the battery expressed as a percentage at the beginning of the $k^{th}$ battery charge range in the $i^{th}$ battery charge interval;

where $p_{final}(i,k)$ is the fractional value of the actual capacity of the battery expressed as a percentage at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

20. A system for determining a wear value of a battery of a mobile electronic device comprising:

a processor; and a tangible, non-transitory memory configured to communicate with the processor, the tangible, non-transitory memory having instructions stored thereon that, in response to execution by the processor, cause the processor to perform operations comprising:

using historical battery status data to estimate an actual capacity $Q_{act}$ of the battery;

using a design capacity $Q_{des}$ of the battery and the estimated actual capacity $Q_{act}$ of the battery to determine the wear value of the battery;

wherein:

the historical battery status data comprises time information and battery charging status information, further comprising using the time information and the battery charging status information to identify one or more battery charge intervals during which the battery was charged and identifying one or more battery charge ranges within each of the one or more battery charge intervals;

the historical battery status data comprises a plurality of historical battery charge data points for each battery charge interval, wherein each historical battery charge data point comprises time information, battery charging current information, and battery charge information;

the time information may comprise a relative time value or time stamp;

the battery charging current information may comprise a value of charging current supplied to the battery; and the battery charge information may comprise a fractional value of the actual capacity $Q_{act}$ of the battery, expressed as a fraction or as a percentage of the actual capacity $Q_{act}$ of the battery; and the processor further performing operations comprising:

determining, for each battery charge range, an estimate $Q_{act}(k)$ of the actual charge capacity $Q_{act}$ of the battery, where k is an index assigned to each battery charge range according to the numerical order in which the fractional values of the actual capacity $Q_{act}$ of the battery in the battery charge ranges occur;

identifying any common battery charge ranges in which the fractional values of the actual capacity $Q_{act}$ of the battery of one battery charge interval overlap with the fractional values of the actual capacity $Q_{act}$ of the battery of any one or more other battery charge intervals; and identifying any unique battery charge ranges in which none of the fractional values of the actual capacity $Q_{act}$ of the battery of one battery charge interval overlap with the fractional values of the actual capacity $Q_{act}$ of the battery of any one or more other battery charge intervals.

21. The system of claim 20, comprising estimating the actual capacity $Q_{act}$ of the battery by averaging the estimates $Q_{act}(k)$ of the actual capacity of the battery for all of the battery charge ranges according to the formula:

$$Q_{act} = \frac{1}{N_k} \sum_{\forall k} Q_{act}(k)$$

where $N_k$ is the total number of battery charge ranges.

22. The system of claim 21, comprising determining the wear value of the battery expressed as a percentage wear value $W_p$ according to the formula:

$$W_p = 100 \times \left(1 - \frac{Q_{act}}{Q_{des}}\right)$$

or determining the wear value of the battery expressed as a fractional wear value $W_f$ according to the formula:

$$W_f = 1 - \frac{Q_{act}}{Q_{des}}$$

where $Q_{act}$ is the estimated actual capacity of the battery and $Q_{des}$ the design capacity of the battery.

23. The system of claim 20, comprising determining, for each common battery charge range and for each battery charge interval to which the common battery charge range is common, an estimate $Q_{act}(i,k)$ of the actual capacity of the battery according to the formula:

$$Q_{act}(i,k)=\Delta Q(i,k) \times 100/[p_{final}(i,k)-p_{initial}(i,k)]$$

where $p_{initial}(i,k)$ is the initial fractional value of the actual capacity of the battery expressed as a percentage at the beginning of the $k^{th}$ battery charge range in the $i^{th}$ battery charge interval;

where $p_{final}(i,k)$ is the final fractional value of the actual capacity of the battery expressed as a percentage at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

24. The system of claim 23, comprising determining, for each common battery charge range and for each battery charge interval to which the common battery charge range is common, the total charge $\Delta Q(i,k)$ supplied to the battery over the $k^{th}$ battery charge range in the $i^{th}$ battery charge interval.

25. The system of claim 24, comprising determining, for each common battery charge range and for each battery charge interval to which the common battery charge range is common, the total charge $\Delta Q(i,k)$ supplied to the battery over the $k^{th}$ battery charge range in the $i^{th}$ battery charge interval according to:

$$\Delta Q(i,k)=I_{avg}(i,k) \times T(i,k)$$

where $I_{avg}(i,k)$ is the average battery charging current supplied to the battery over the $k^{th}$ battery charge range in the $i^{th}$ battery charge interval, and $T(i,k)$ is the duration of the $k^{th}$ battery charge range in the $i^{th}$ battery charge interval determined according to the formula:

$$T(i,k)=t_{final}(i,k)-t_{initial}(i,k)$$

where $t_{initial}(i,k)$ is the relative time value or time stamp corresponding to the first battery charge data point of the $k^{th}$ battery charge range in the $i^{th}$ battery charge interval, and $t_{final}(i,k)$ is the relative time value or time stamp corresponding to the last battery charge data point of the $k^{th}$ battery charge range in the $i^{th}$ battery charge interval.

26. The system of claim 23, comprising determining, for each common battery charge range, an average of the estimates $Q_{act}(i,k)$ of the actual capacity of the battery over each battery charge interval to which the common battery charge range is common so as to provide an improved estimate $Q_{act}(k)$ of the actual capacity $Q_{act}$ of the battery for the $k^{th}$ battery charge range according to the formula:

$$Q_{act}(k) = \frac{1}{N_{icom}(k)} \sum_{\forall i \in i_{com}} Q_{act}(i,k)$$

where $\forall i \in i_{com}$ indicates that the summation should be performed over all of the battery charge intervals to which the $k^{th}$ battery charge range is common and $N_{icom}(k)$ is the number of battery charge intervals to which the $k^{th}$ battery charge range is common.

27. The system of claim 20, comprising determining, for each common battery charge range and for each battery charge interval to which the common battery charge range is common, an estimate $Q_{act}(i,k)$ of the actual capacity of the battery according to the formula:

$$Q_{act}(i,k)=\Delta Q(i,k)/[f_{final}(i,k)-f_{initial}(i,k)]$$

where $f_{initial}(i,k)$ is the initial fractional value of the actual capacity of the battery expressed as a fraction at the beginning of the $k^{th}$ battery charge range in the $i^{th}$ battery charge interval;

where $f_{final}(i,k)$ is the final fractional value of the actual capacity of the battery expressed as a fraction at the end of the $k^{th}$ battery charge range in the $i^{th}$ battery charge interval; and where $\Delta Q(i,k)$ is the total charge supplied to the battery over the $k^{th}$ battery charge range in the $i^{th}$ battery charge interval.

28. An article of manufacture for determining a wear value of a battery of a mobile electronic device including a non-transitory, tangible computer readable storage medium having instructions stored thereon that, in response to execution by a computer-based system, cause the computer-based system to perform operations comprising:

using historical battery status data to estimate an actual capacity $Q_{act}$ of the battery; and using a design capacity $Q_{des}$ of the battery and the estimated actual capacity $Q_{act}$ of the battery to determine the wear value of the battery;

wherein:
the historical battery status data comprises time information and battery charging status information, further comprising using the time information and the battery charging status information to identify one or more battery charge intervals during which the battery was charged and identifying one or more battery charge ranges within each of the one or more battery charge intervals;

the historical battery status data comprises a plurality of historical battery charge data points for each battery charge interval, wherein each historical battery charge data point comprises time information, battery charging current information, and battery charge information;

the time information may comprise a relative time value or time stamp;

the battery charging current information may comprise a value of charging current supplied to the battery; and the battery charge information may comprise a fractional value of the actual capacity $Q_{act}$ of the battery, expressed as a fraction or as a percentage of the actual capacity $Q_{act}$ of the battery; and the computer-based system further performs operations comprising:
determining, for each battery charge range, an estimate $Q_{act}(k)$ of the actual charge capacity $Q_{act}$ of the battery, where k is an index assigned to each battery charge range according to the numerical order in which the fractional values of the actual capacity $Q_{act}$ of the battery in the battery charge ranges occur;

identifying any common battery charge ranges in which the fractional values of the actual capacity $Q_{act}$ of the battery of one battery charge interval overlap with the fractional values of the actual capacity $Q_{act}$ of the battery of any one or more other battery charge intervals; and identifying any unique battery charge ranges in which none of the fractional values of the actual capacity $Q_{act}$ of the battery of one battery charge interval overlap with the fractional values of the actual capacity $Q_{act}$ of the battery of any one or more other battery charge intervals.

* * * * *